(12) United States Patent
Pillkahn (10) Patent No.: US 6,617,869 B1
(45) Date of Patent: Sep. 9, 2003

(54) ELECTRICAL CIRCUIT WITH A TESTING DEVICE FOR TESTING THE QUALITY OF ELECTRONIC CONNECTIONS IN THE ELECTRICAL CIRCUIT

(75) Inventor: Ulf Pillkahn, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/637,754

(22) Filed: Aug. 11, 2000

(30) Foreign Application Priority Data

Aug. 12, 1999 (DE) .......................................... 199 38 060

(51) Int. Cl.[7] ........................ G01R 31/02; G01R 31/08; G01R 31/28; G01R 31/11
(52) U.S. Cl. ........................ 324/763; 324/535; 324/533; 714/733; 714/734
(58) Field of Search .................. 324/763, 765, 324/523, 527, 535, 555, 538, 532, 533; 714/732, 735, 736, 737, 742, 733, 734

(56) References Cited

U.S. PATENT DOCUMENTS

| | | | |
|---|---|---|---|
| 5,056,094 A | | 10/1991 | Whetsel |
| 5,796,751 A | | 8/1998 | Kundu |
| 5,903,156 A | * | 5/1999 | Matsumaru et al. ......... 324/533 |
| 6,097,203 A | * | 8/2000 | Parker et al. ............... 324/763 |
| 6,104,198 A | * | 8/2000 | Brooks ........................ 324/538 |
| 6,314,039 B1 | * | 11/2001 | Hill et al. ..................... 714/742 |

OTHER PUBLICATIONS

IEEE Standard Test Access Port and Boundary–Scan Architecture, IEEE Standard 1149.1 (1990), pp. 1–1 –1–5.

* cited by examiner

*Primary Examiner*—N. Le
*Assistant Examiner*—Anjan K. Deb
(74) *Attorney, Agent, or Firm*—McCormick, Paulding & Huber LLP (57) ABSTRACT

Given the inventive electrical circuit with a device for testing connections in electrical circuits, the change of a test signal (27) due to the effect of a long line is used for determining the quality of an electrical connection (e.g., of a pin). In particular, a determination about the terminating impedance and, thus, about the quality of the connection, is made by defining a maximum value of the test signal (28) reflected at the line end. An existing boundary scan test implementation with appropriate expansions can thereby be used, including a test controller. Standard digital signals can be employed as test signal when their propagation time is lengthened by a delay element.

31 Claims, 5 Drawing Sheets

ELECTRICAL CIRCUIT WITH A TESTING DEVICE FOR TESTING THE QUALITY OF ELECTRONIC CONNECTIONS IN THE ELECTRICAL CIRCUIT

BACKGROUND OF THE INVENTION

1. Field of the Invention

The present invention is directed to an electrical circuit with a testing device for testing electrical connections in the electrical circuit. The invention is also directed to an electrical component having such an electrical circuit in integrated form. The present invention is also directed to a method for testing the quality of electrical connections in electrical circuits.

2. Description of the Related Art

It is known to test the quality of the connections of electronic assemblies with an in-circuit tester. An external tester is thereby connected to the assembly or assemblies under test with a needle bed adapted. Needles are mechanically positioned to measuring points—called measuring pads—that are already provided on the circuit. The testing points or, respectively, components are selected and provided with defined voltage levels via these mechanically placed and electrically driven needles. Faults are recognized by measuring and comparing the voltages at the output side of the measuring points to anticipated values.

These known testing methods have the disadvantage that the number of test pads to be separately provided increases greatly with the number of planned tests and the number of assemblies to be selected for a test. This particularly impedes the desired integration and high density of the assemblies on a printed circuit board. A needle mechanically placed onto a measuring point (test pad) requires a certain minimum size, since mechanical tolerances and the cost outlay for continued miniaturization must be taken into consideration. Special components, for example, components provided with cooling members, or large-scale integrated components having several 100 pins can therefore not be measured due to the limited space on the motherboard.

Given modern ball grid array (BGA) components that are characterized in that all connections to the printed circuit board are located under the component, it is practically impossible to provide test pads for all of these terminals without in turn destroying the advantages of this space-saving structure.

Furthermore, a mechanically high-precision and expensive needle bed adapter must be fabricated for each motherboard and must usually also be fabricated for different tests on the same motherboard. The fabrication takes a long time; this delays the development of a circuit, and the needle bed adapter is itself susceptible to malfunction.

It is also known to test circuits with a boundary scan test. Given this, a part of the test logic is integrated into the component. The basic idea is to insert a boundary scan cell as part of the integrated circuit itself between each pin terminal and the actual integrated circuit. A transmitter cell and a receiver cell is thereby needed for testing a connection. During the normal operating condition, the boundary scan cell transmits the received values from the input to the output. In the test mode, it reads the input value out and outputs a selectable test value at the output. All boundary cell scan test cells are connected to one another by a test bus. The data are connected on an external tester via this test bus during the test. The test bus standardized according to IEEE 1149.1 enables the test control and the data exchange.

What is disadvantageous about this Prior Art is that the method is dependent on external testing devices due to the extremely high calculating performance. Many test vectors are needed, i.e., sets of test values to be applied to the measuring points, with which, for example, a specific command is communicated to the circuit under test. As a result, a vector for the resulting values in turn is produced at the pins. In order to test the correct connections of the components to the printed circuit board, the functionality of specific elements and assemblies must be tested. To this end, however, many test vectors must be utilized and the result vectors that are obtained must be compared to the anticipated values. The external testing equipment must therefore provide a considerable calculating capacity; a separate computer is usually utilized for this purpose. Furthermore, when the results do not agree with the anticipated values, the result vectors usually contain little, if any, information about the nature of the fault.

None of the known testing devices can be completely integrated into a component in order to test electrical connections in the circuit in which they are employed. The quality of the connection can only be determined after a higher-ranking comparison, to which the values must be output and that usually does not take place on the electrical circuit itself but in one of the aforementioned external testing devices.

Consequently, it is not possible (or is possible only with significant expenditure) to integrate self-tests into the circuits. But this integration will be required for future assemblies and circuits.

As a self-test (during the service life) of a circuit, the implementation of a logic test has been previously known, by which a "program" is run in agreement with the normal function and, for the anticipated, "correct" results, it is assumed that the circuit is okay overall.

In addition, it is also known to find interruptions in transmission lines such as coaxial lines in that a signal is reflected at the fault location and the point of the interruption is determined from the signal propagation time.

SUMMARY OF THE INVENTION

The invention is therefore based on the object of offering an electrical circuit that does not require any external testing equipment for testing the quality of electrical connections on the circuit and that nonetheless enables a determination of the quality of the electrical connections in a simple way. A further object of the present invention is to offer a corresponding method for testing the quality of electrical connections in electrical circuits.

The above-described object is inventively achieved by an electrical circuit comprising a testing device for testing electrical connections quality in the electrical circuit, a test signal generator for generating a test signal and supplying the generated test signal to an electrical connection to be tested, an evaluator for receiving a reply signal from the connection under test in response to a supplied the test signal, the evaluator being configured for registering a propagation time between test signal and reply signal, and comparing the reply signal to an anticipated signal, and evaluating a quality of the tested electrical connection on a basis of the propagation time and the signal comparison.

The object of the invention is also achieved by a method for testing a quality of electrical connections in electrical circuits, comprising the steps of generating a defined test signal, supplying the generated test signal to an electrical connection to be tested, receiving a reply signal from the connection under test in response to the supplied test signal, determining a propagation time between the test signal and the reply signal; and comparing the reply signal to an anticipated signal for evaluating a quality of the electrical connection.

The inventive electrical circuit comprises a testing device composed of a test signal generator for generating a test signal and supplying this test signal to an electrical connection to be tested.

Furthermore, an evaluator is provided for the reception of a reply signal to a supplied test signal by the connection to be tested, by which the evaluator registers the propagation time between a test signal and a reply signal, compares the reply signal to an anticipated signal, and evaluates the quality of the tested electrical connection on the basis of the propagation time and of the signal comparison.

Advantageously, the effect of the modification of an electrical signal or pulse during the signal run that is otherwise undesired in digital circuits is precisely what is used. What is exploited is the fact that electrical connections are not ideal and one can only approximately assume an ideal transmission that does not change the shape of the signal. Capacitative, inductive, attenuating and reflective influences occur. Contrary to the previous opinion of the art that accorded no informational content to these changes of the digital signals and attempted to prevent the signal from changing over the propagation time, it is precisely these signal changes during operation of digital circuits that are inventively interpreted. The image of the reply signal is typical of the traversed path. When the test signal is observed, for example a square-wave signal resolved into its wave functions, the reply signal contains information about the characteristic impedance that the test signal experienced on the electrical connection under test.

It is also advantageous when the test signal generator supplies the test signal to the same end of the electrical connection under test at which the evaluator receives the reply signal. As a result of this, the signal reflected by the electrical circuit at the end of the electrical connection under test or by a preceding fault can be received as reply signal. This makes it possible to concentrate all of the components needed for the electrical circuit with testing device of the species described here in compact fashion at one location. In particular, these can be concentrated in an integrated circuit on a component.

It is also advantageous to fashion the electrical circuit such that the test signal generator generates a test signal having a signal width tab, so that the length over which the test signal runs on the connection under test at the appertaining wavelength $\lambda \approx 2t_{ab} \times V_p$ is greater than approximately $\lambda/2$. The test signal is thereby viewed as half-wave of a periodic signal. The typical propagation velocity of an electrical signal in a digital circuit is set as $V_p$.

Standard propagation velocities in digital circuits are approximately 60%–70% of the speed of light. The value $V_p$ is thus set at approximately 60 percent of the speed of light or to a value corresponding to the circuit on a case-by-case basis.

A test of the above-described type can be especially favorably realized when this signal width is downwardly transgressed. According to the theory relating to long lines, the length of the line via which the test signal runs is to be taken into consideration under these conditions. The error occurring as a result thereof for the case of normal operation of a digital circuit can then no longer be neglected. Since the test given the inventive testing device is based on the principle of modifying the test signal, it is advantageous to adapt the signal width to this propagation time condition. It is also beneficial to add a safety margin of 100% to this condition insofar as possible and to then set the running length of the test signal greater than $\lambda$ in order to assure the applicability of the theory of the long line in any case.

A technically beneficial solution is to lengthen the propagation time of the test signal on the electrical connection under test in that a delay element is connected between test signal generator and connection under test. This delay element—given a test signal with a signal width $t_{ab}$ generated by the test signal generator—lengthens the propagation time of the test signal over the electrical connection under test such that the apparent length over which the test signal runs on the connection under test is greater than approximately $\lambda/2$ at the appertaining wavelength $\lambda \approx 2t_{ab} \times V_p$.

The condition beneficial for the testing device disclosed here, to the extent that the laws of the long line can be applied, can also be achieved when the test signal generator generates a test signal with a signal rise time $t_r$, defined as the time span in which the signal rises from 10% of its value to 90% of its value, so that the propagation time of the test signal over the electrical connection under test is greater than approximately $t_r$.

Just as in the above-described embodiments, it is also beneficial here to also add a safety margin of 100% to this condition insofar as possible and to then set the propagation time of the signal greater than $2t_r$. The signal rise time is thus short in comparison to the test signal propagation time over the electrical connection under test.

This advantage is also achieved in that a delay element is connected between test signal generator and connection under test. This delay element—given a test signal with a signal rise time $t_r$—defined as time span in which the signal value rises from approximately 10% of its value to 90% of its value—is generated by the test signal generator and lengthens the propagation time of the test signal over the electrical connection under test to more than $t_r$.

In the above-described embodiments, standard pulses can also be advantageously employed as the test signal without having to provide complicated and expensive components for especially fast signal rise times or short signal widths. Since the effect of a lengthening of the propagation time of a signal is not desired in normal operation for a digital circuit, since errors occur as a result of such a lengthening and the working speed of the circuit is reduced, this only occurs when the circuit with the electrical connections to be tested is in the test mode. Only then is a delay element connected between the electrical connection under test, for example, the pin of an integrated component and the test signal generator or, respectively, evaluator.

Advantageously, the evaluator defines a maximum value of the reply signal, checks whether the maximum value of the reply signal lies within a time span $t_1$ through $t_2$, and then compares the reply signal to the anticipated signal. The limitation to the definition of the maximum value and the determination as to whether this lies in a time window of an anticipated reply signal simplifies the evaluation. The complete signal image need not be acquired. Above all, the signal need not be sampled, which would being very involved according to the sampling theorem. Potential other signals that do not derive from the test signal are filtered out by a time limitation mechanism, for example a gate circuit.

For determining the maximum value, the evaluator can compare the reply signal to reference voltage in analog fashion and store a value (e.g., a "1", in a latch for every exceeded reference voltage), and can then convert these values into a data word of a specific width in a decoder. The reply signal is thus first quantized analog and then converted into a thermometer/digital code. Even when a specific value is only exceeded once, a "1" is set for the value in the latch. Accordingly, a series with values "1" reside in the latch after the measuring time up to the value that corresponds to the maximum value, otherwise values "0" result.

A decoder can then convert this thermometer/digital code into a standard digital value having a specific word width. It is advantageous that the determination of the maximum value is fast and does not cause any calculating outlay since only the maximum value is acquired.

Beneficially, the evaluator can compare the maximum value of the reply signal to an anticipated value upon allowance of a tolerance and thus evaluate the quality of the electrical connection. The evaluation of the reply signal ultimately ensues by an analysis of the reflection coefficient P. This is defined here as a ratio of the test signal maximum to the reply signal maximum. Which value is present for P is ultimately tested by prescribing an anticipated value for the maximum value of the reply signal. The actual comparison can ensue, for example, by forming a digital value having a specific bit width from the analog value and comparison to a likewise digitalized, anticipated value. Since a number of errors are conditioned by the analog-to-digital conversion, exact agreements of maximum value and anticipated value cannot be achieved in the comparison of the encoded measured values. A defined tolerance is therefore provided in that, for example, a specific plurality of last bits is left out of consideration in the comparison of the code words. A tolerance is also allowed given some other, standard type of comparison in order to take scatter and measuring imprecision into consideration. Since the reflection of the test signal at the end of the electrical connection under test is essentially dependent on the terminating impedance, the comparison of the maximum value of the reply signal to the anticipated value and, thus, the test for a specific value of P advantageously allows statements not only about the existence of a fault but, in case of a fault, also about the nature of the fault to a certain extent when significant values are interrogated as anticipated values for specific faults. The terminating impedance of an electrical connection anticipated in the "good" case is unambiguously defined for the circuit when this itself is in a specific, defined condition. By way of example, thus, a defined input impedance is expected for a specific input of a component with an integrated circuit when this is located at the end of the connection under test and when the component is in a defined condition.

Furthermore, the evaluator can compare the maximum value of the reply signal to the negative maximum value of the test signal as an anticipated value and thereby recognize an electrical connection to ground as being a proper condition and a faulty connection as a short to ground. Another advantageous simplification of the testing device derives as a result thereof. A check is carried out to see whether the value P≈−1 is present. A connection to ground (GND) is established for the "good" case. When a fault has already been detected, the test for this value can recognize the short of this connection to ground (being stuck at 0). It is advantageous that this "good" case and the described fault can be determined without a significant calculation and simulation of the circuit.

Advantageously, the evaluator can compare the maximum value of the reply signal to zero and thereby recognize an electrical connection to another component with suitable input impedance as a proper condition and a faulty connection to another component with high-impedance input as shorted to another electrical connection when the nature of the fault is analyzed after a detected fault.

The evaluator can compare the maximum value of the reply signal to the positive maximum value of the test signal as an anticipated value and thereby recognize an electrical connection to an open terminal as being in a proper condition and a faulty connection as being interrupted.

Inventively, a test controller can be provided that collects the test results and outputs them via an interface.

Furthermore, according to the invention, an electrical component with an integrated circuit is provided that comprises an integrated circuit with an above-described electrical circuit. The analysis of potential faults can thus ensue on every component with integrated circuit itself. What is also beneficial compared to previously known embodiments of the Prior Art is that the necessary calculating power and the logistic outlay are reduced. The terminals of a component (e.g., an IC) can be checked in this way for correct connections without external registers or mechanical adaptation. For an electrical circuit with testing device disclosed here, no higher-ranking comparison of the values of the individual components of an electrical circuit is necessary.

This component can be beneficially implemented in that all terminals (pins) of the component for the connection of further components are connected star-like (in a star configuration) to a single test signal generator and the test signal generator successively supplies the terminals with a test signal, and all terminals are likewise connected star-like (in a star configuration) to a single evaluator that successively receives the reply signals.

Advantageously, potentially existing boundary scan cells according to the JTAG standard can conduct the test signal to the connections under test, where these cells are expanded by two drivers.

It is beneficial to implement an electrical component of the above-described species with an electrical circuit with a test controller that collects the test results and outputs them via an interface, as described above, such that the test controller present, given a test architecture according to the boundary scan method, outputs the test results, and the control command set of the test controller is expanded by a command to output the test results. A number of versions of this embodiment can be implemented. Thus, it is possible to implement the test controller on the electrical circuit integrated in the component. However, it is also possible to provide the test controller in the overall electrical circuit in which the component is utilized. As a result of this, it is possible to output the results of the tests in a plurality of components of the above-described species with the assistance of one test controller.

According to the invention, a method for testing the quality of electrical connections in electrical circuits is also provided.

A test signal is generated first in this method and is supplied to an electrical connection under test. A reply signal to a supplied test signal is then received from the connection under test; the propagation time between test signal and reply signal is then determined. The reply signal is compared to the anticipated signal in order to evaluate the quality of the electrical connection.

Beneficially, the test signal is supplied at the same end of the electrical connection under test at which the reply signal is received. As a result, the reflected signal can be received as described above on the basis of the electrical circuit.

A test signal having a signal width $t_{ab}$ can be employed, so that the length over which the test signal runs on the connection under test at the appertaining wavelength $\lambda$ is greater than approximately $\lambda/2$.

The propagation time of the test signal over the electrical connection under test is beneficially lengthened such that the apparent length over which the test signal runs on the connection under test is greater than approximately $\lambda/2$ at the appertaining wavelength $\lambda$. As described for the electrical circuit, standard methods of signal generation can thus be applied without particular effort.

The test signal can have a signal rise time $t_r$, defined as time span in which the signal rises from 10% of its value to 90% of its value, so that the propagation time of the test signal over the electrical connection under test is greater than approximately $t_r$.

The propagation time of the test signal over the electrical connection under test can be lengthened such that, given a signal rise time $t_r$, defined as time span in which the signal rises from 10% of its value to 90% of its value, the propagation time is greater than approximately $t_r$.

Beneficially, the maximum value of the reply signal is determined, and a check is carried out to see whether the maximum value of the reply signal lies within a time span $t_1$ through $t_2$, and the reply signal is then compared to the anticipated value.

For determining the maximum value of the reply signal, the reply signal can be compared to reference voltages in analog fashion and a value can be stored in a latch for every exceeded reference voltage, and these values can then be converted into a data word of a specific width in a decoder.

The maximum value of the reply signal can be compared to an anticipated value upon allowance of a tolerance, and the quality of the electrical connection can thus be evaluated.

Advantageously, the maximum value of the reply signal is compared to the negative maximum value of the test signal as an anticipated value and an electrical connection to ground is thereby recognized as being a proper condition and a faulty connection is recognized as a short to ground.

The maximum value of the reply signal can be compared to zero and an electrical connection to another component with suitable input impedance can be recognized as a proper condition and another connection to a component with a high-impedance input can be recognized as shorted to another electrical connection.

The maximum value of the reply signal can be compared to the positive maximum value of the test signal as an anticipated value, and an electrical connection to an open terminal can thereby be recognized as being a proper condition and another connection can be recognized as interrupted.

Furthermore, with an integrated component, a test signal from a single test signal generator can be successively supplied to all of its electrical connections to be tested to some other electrical circuit, to the pins, whereby the reply signals are successively received and evaluated in a single evaluator.

Finally, a test controller can be offered and the test results can be collected via the test controller and be output via an interface.

The invention is now explained in greater detail on the basis of an exemplary embodiment of an electrical circuit integrated in an electrical component. An embodiment with test controller given a simultaneously existing boundary scan test architecture is shown.

DESCRIPTION OF THE PREFERRED EMBODIMENTS

Figure 1:
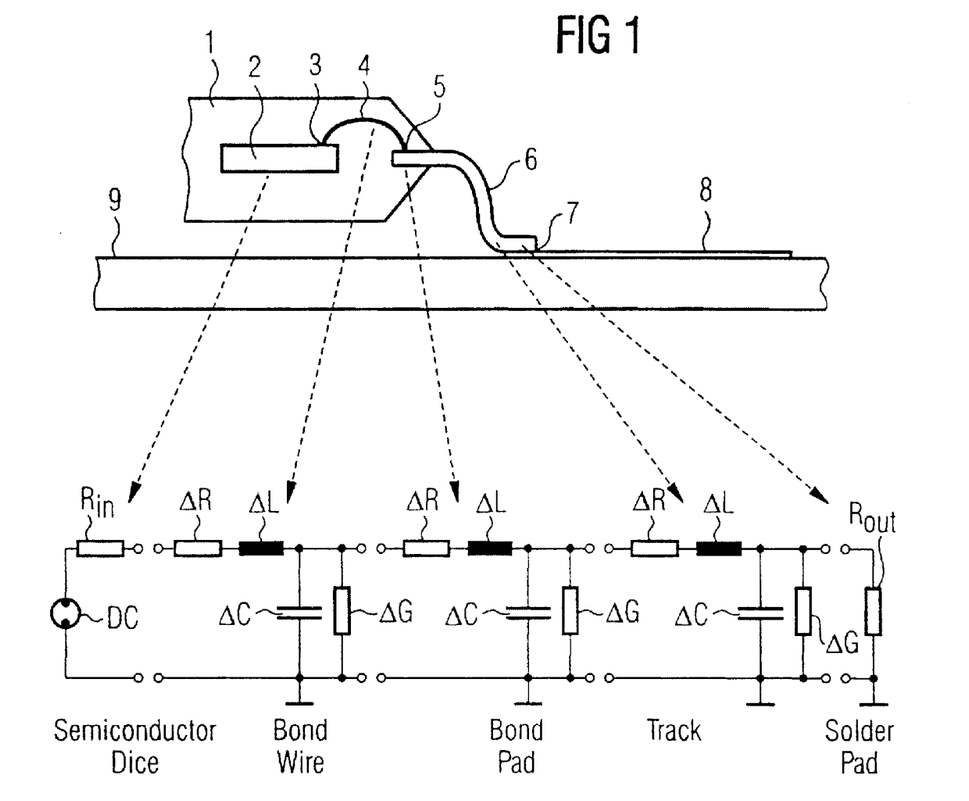
FIG. 1 is a side view and an electrical schematic of an electrical component with an electrical connection to be tested, with reference to the example of what is referred to as an SMD connection.

FIG. 1 shows a part of an electrical component 1 with integrated circuit 2 and an electrical connection from the integrated circuit 2 to the interconnect 8. The connection shown here by way of example is an SMD (surface mounted device) connection, in which the connections from the component 1 to the printed circuit board 9 (the pins) are soldered directly onto the printed circuit board 9 without being conducted through a bore in the printed circuit board 9. Proceeding from its end point 3 on the integrated circuit 2, the electrical connection is composed of a bond wire 4, the connection point 5 of the bond wire to the pin 6, the pin 6 itself and the solder point 7 of the pin. The connecting interconnect 8 and the printed circuit board 9 are also entered. This leads to the rest of the electrical circuit in which the component is installed.

An equivalent circuit diagram of the electrical connection is shown under this. In this, bond wire 4, connection point 5, pin 6 and solder point 7 are viewed as being independent sections of the electrical connection. For analysis of its electrical behavior, each section can be replaced by the Ohmic line impedance $\Delta R$ devolving onto the section, an inductance $\Delta L$ and a capacitance $\Delta C$ as well as a terminating impedance $\Delta G$ that a signal interacts with in this section upon transition into the next section, insofar as the signal is considered to be a propagating wave. An internal resistance $R_{in}$ is set for the integrated circuit itself. The solder point 7 on the interconnect 8 is set as $R_{out}$ as an equivalent. For illustration, the sections in FIG. 1 are illustrated directly by arrows from the electrical SMD connection shown immediately above.

The testing device is integrated into the integrated circuit. The generation of the test pulse can ensue, for example, by a clock-controlled uni-vibrator. Alternatively to this cost-beneficial and space-saving solution, tunnel diodes are suited for generating even steeper signal edges. It can be assured by a delay element that the above-described conditions for the signal rise time $t_r$ are adhered to. $t_r$ should be smaller than the signal propagation time. Alternatively, the signal propagation time can be delayed to such an extent that, given the wavelength $\lambda$ corresponding to the signal width, the apparent length over which the test signal runs on the connection under test is greater than approximately $\lambda/2$. As a result of the delay element, it is not absolutely necessary to implement a complicated solution as a test signal generator that can generate extremely steep pulse edges; rather, a standard solution suffices.

Figure 2:
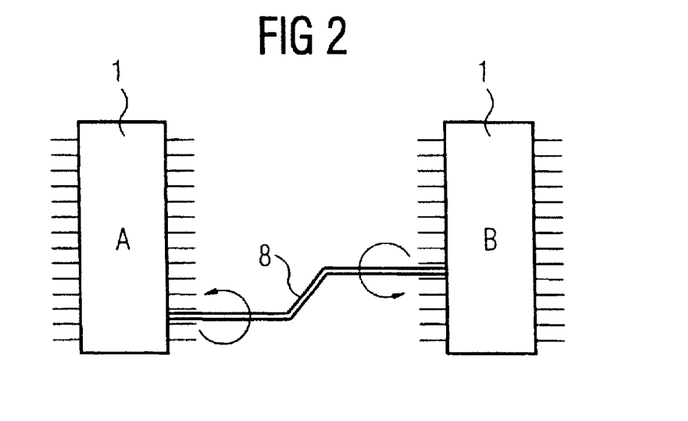
FIG. 2 is a schematic diagram of two components and an electrical connection connecting them.

FIG. 2 shows two components 1 with the testing device disclosed here, additionally referenced A, B for further distinction, and a schematic electrical connection in the form of the interconnect 8 between two terminals of the components 1. Each of the two components can then independently test with the testing device disclosed here as to whether the electrical connection up to and including the interconnect is in a proper condition. This is indicated by the circular arrow in the drawing. It stands for the path of the test signal that, reflected, runs to the end of the electrical connection placed in the component.

No higher-ranking comparison is thus needed, in contrast to the Prior Art, for example, the testing method with logic tests and boundary scan elements. A statement about the connections is first possible not only when a component applies logic commands (test vectors) to the pins and the result is read out at the other component and compared in a higher-ranking fashion.

According to the embodiment described here, the component itself can already implement a test dependent on the anticipated terminating impedances at the other end of the electrical connections, here the input impedance of the pin of component B as seen proceeding from component A, without having to take the remaining logic behavior of the circuit in which the components are installed into consideration.

Figure 3:
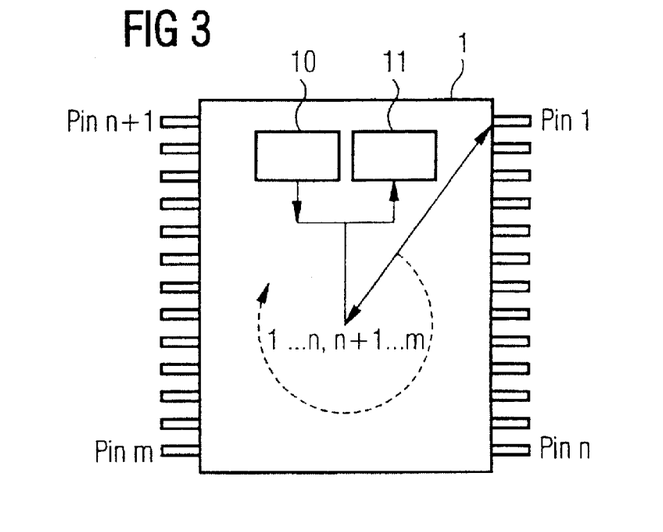
FIG. 3 is a functional device diagram showing the structural principle of a test signal feed and of an evaluator.

FIG. 3 shows the further structure of the testing device in a component 1 which includes a test signal generator 10 and an evaluator 11. A multiplexer is also provided, this successively applying the test signal to the individual electrical connections under test, the pins here. This is shown in the drawing by the arrow to pin No. 1 and the successively ensuing cut-in by the circular, broken-line arrow.

A switch function that connects the active electrical connection under test at the moment to the test signal generator and the evaluator is thereby implemented at each pin or at the beginning of the electrical connection under test.

The delivery of the evaluation signal to the evaluator ensues in an opposite manner, in that the connection at which a reply signal is anticipated at the moment is likewise successively connected to the evaluator 11 by a multiplexer.

Figure 4:
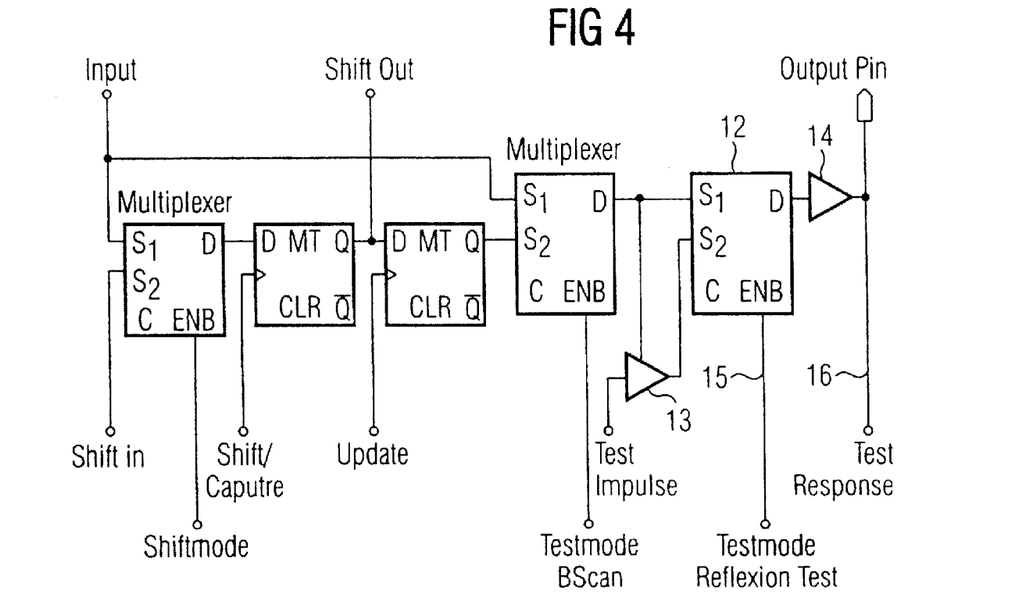
FIG. 4 is a schematic illustrating a modified boundary scan cell.

FIG. 4 explains how the delivery of the test signal to the pins ensues upon employment of the existing boundary scan test architecture. The Figure shows a boundary scan cell according to the JTAG standard that is expanded by two drivers 13 and 14. A multiplexer 12 is also additionally provided for the above-described selection of the pin to be tested. When the signal for the test mode is applied to the input ENB, the input for the test mode type 15, then the test signal is conducted via a driver 13 and the multiplexer 12 to the output. When the test mode is not activated, then the input signal is forwarded directly to the output. The reply signal is received at the evaluation signal output 16. The integration into an existing test architecture offers the advantage that both tests can be implemented. The added outlay for this is relatively slight. Given components with an extremely low number of pins, however, a solution without a simultaneous implementation of boundary scan cells would likely be more beneficial.

Figure 5:
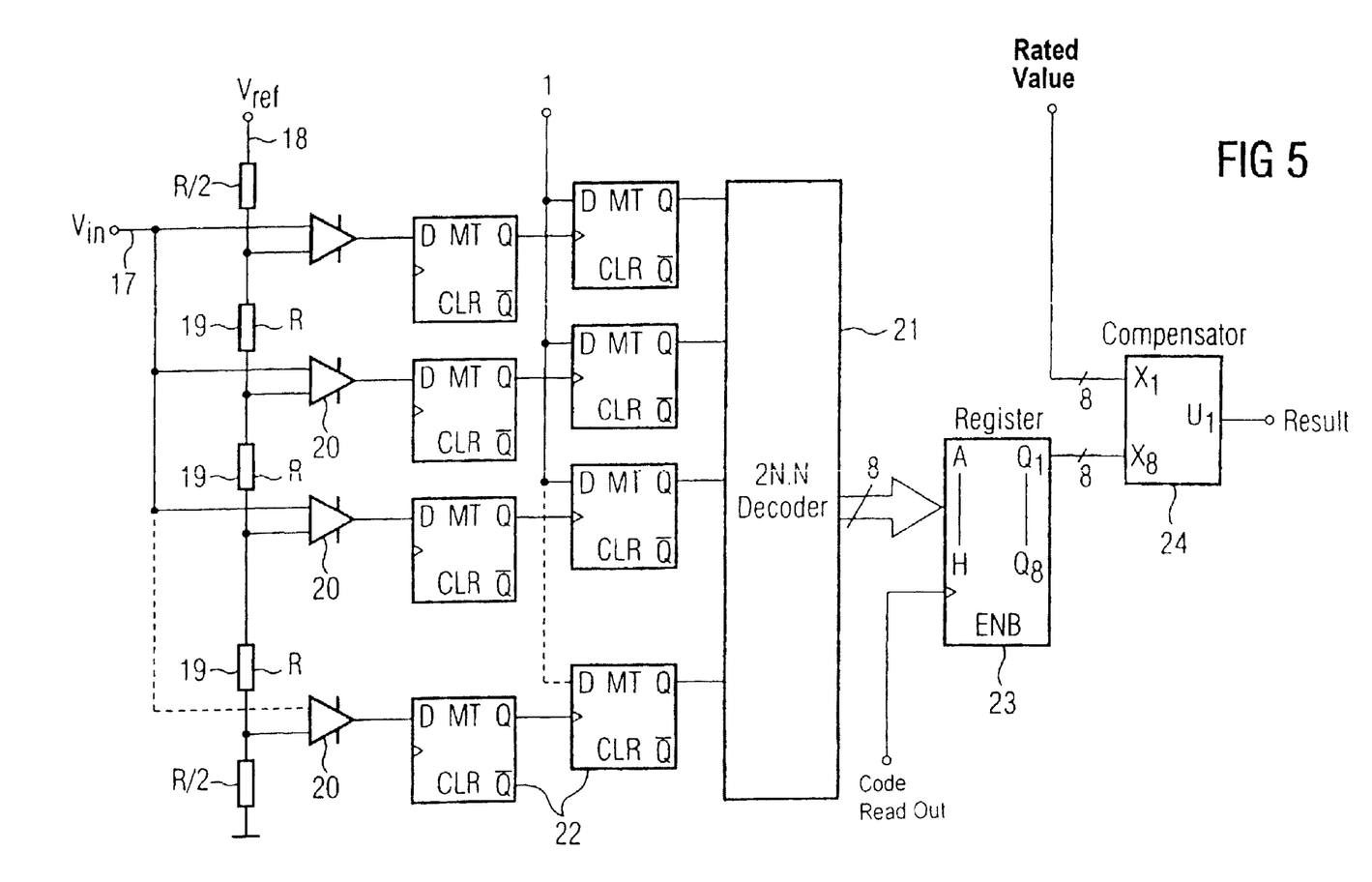
FIG. 5 is a circuit diagram of an evaluator.

FIG. 5 shows the circuit diagram of an embodiment of the evaluator 11 described here by way of example. This is composed of a reference voltage divider that prescribes reference voltages in fixed graduations via resistors 19 that are divided off from the circuit adjacent at the reference voltage input 18. This is followed by analog comparators 20. The analog comparators forward their result into a following latch 22. A decoder 21 and the actual evaluation unit, composed of a register 23 and a digital comparator, are connected to the latch 22.

The evaluation signal is applied to the evaluation signal input 17. This is then compared to all values by the reference voltage divider by the resistors 19. When the evaluation signal exceeds the value of a specific step, the respective analog comparator 20 forwards a signal to the following latch 22.

The "sampling" itself ensues via a gate circuit that acquires the reply signal between the values $t_1$ and $t_2$. Insofar as electrical connecting lines are to be tested in simple circuits in which multiple reflections are not expected, it is adequate to select the time gate between $t_1$ and $t_2$ such that $t_1$ corresponds to the start time of the test signal and $t_2$ corresponds to a value $2\tau+t$ with $\tau$ as an anticipated propagation time of a signal over the electrical connection under test in a single direction and t as a safety margin. In this case, the reflected signal is acquired in every instance.

The decoder 21 converts the information into a data word, here having a width of 8 bits. Given a data word width of 8 bits for the decoder, a comparison to 255 compartmentalized reference values is accordingly necessary.

The result is written into a register 23 and subsequently compared to the anticipated value in a digital comparator 24. In order to allow a tolerance, a suitable plurality of last bits should not be considered, since an exact coincidence is probably precluded due to the above-described, multiple conversion of the reply signal.

In contrast to standard A/D converters, the reply signal is quantized first. The corresponding memory cell of the following latch is set at every exceeded value of the reference voltage, which is present in steps. A "thermometer code" is present, by which a value "1" is assigned to each of the values prescribed by the graduated reference voltage when the value is exceeded. The latch consequently stores that highest value of the reply signal that has been reached (the maximum value) in that the value "1" resides in a series up to the position that corresponds to the maximum value of the reply signal, which may only have been briefly reached once. The advantage of such a parallel quantization is the high process speed.

Figure 6:
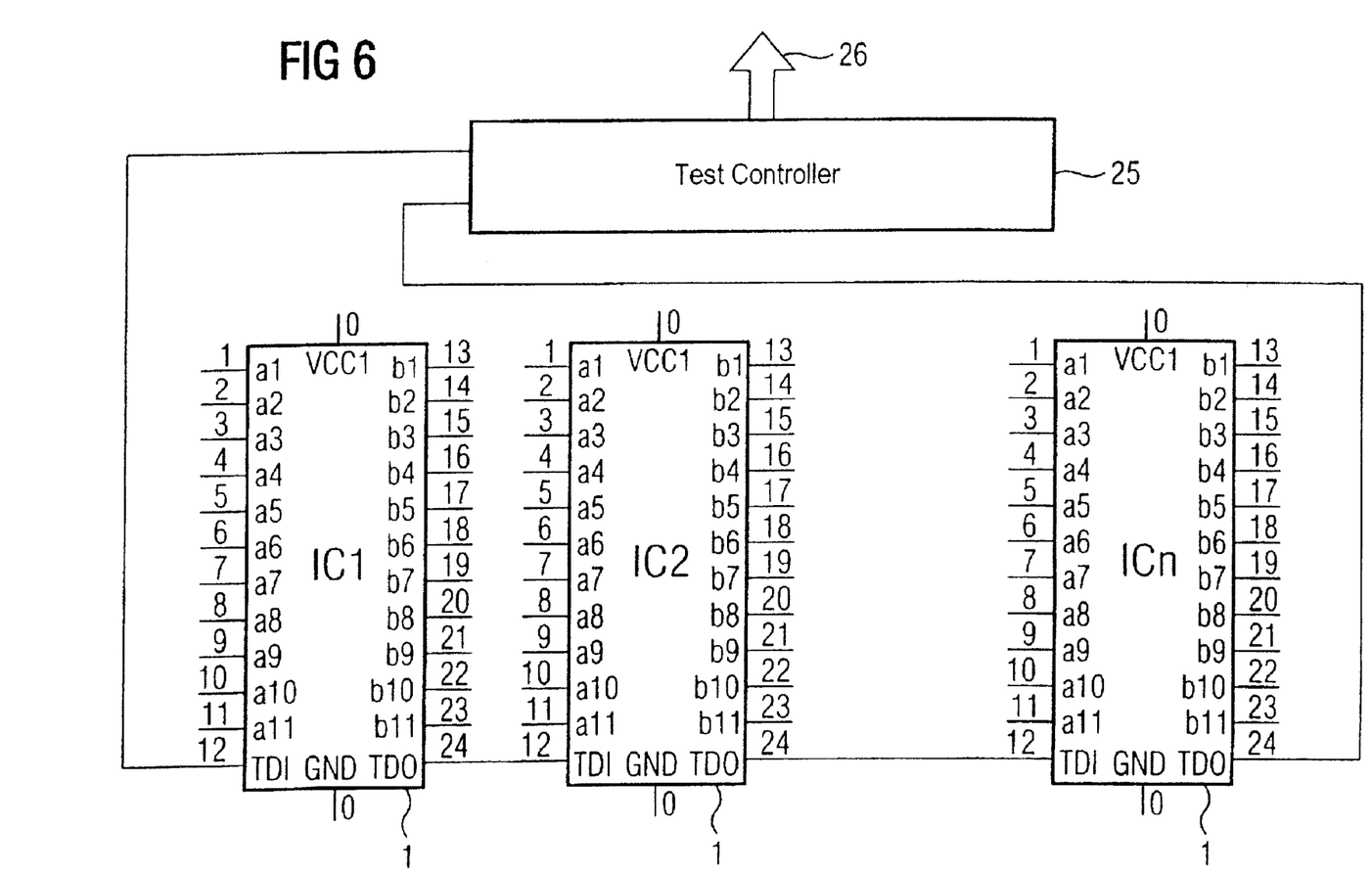
FIG. 6 is a circuit diagram illustrating an embodiment of the inventive electrical circuit with external test controller.

FIG. 6 shows an embodiment with an external test controller for an existing boundary scan test architecture. Components 1—three are entered here by way of example—having a respective testing device of the species previously described are connected to a test controller 25 that fetches the results of the testing device integrated on each component 1 via a data line. The controller has an interface 26 for the output of the data outside the electrical circuit. For an existing test architecture according to the boundary scan method, the existing TAP test controller that outputs the test results of the boundary test scan is advantageously employed in that it is appropriately expanded and its control command set is expanded by a command for the output of the test results of the testing device disclosed here.

Alternatively, it is conceivable to integrate the test controller in one or more of the components 1.

The embodiment shown in FIG. 6 has the advantage that the test results can be interrogated from the outside by data calling. It is thus possible for digital circuits that are/can be connected to a data transmission line (as is the case, e.g., for telephone switching systems) to make a remote diagnosis as to whether an error is present in a connection on the circuit or, conversely, whether a component fault is more probable.

The advantageous possibility of limiting oneself to testing for a few typical errors in order to obtain a simple test evaluation is explained on the basis of FIGS. 7 through 9b. These Figures show the result of respective simulation calculations. The equivalent circuit diagram as shown in FIG. 1 has been selected as model for the electrical connection. However, a further simplification was undertaken in that no division into sections was undertaken. What is mainly decisive for the signal image is the terminating impedance at the end of the electrical connection. When the simulation is refined further, then further reflections occur at the transfer resistances of the sections; in the simplification selected here, however, these are negligible since the terminating impedance at the end of the connection under test causes the greatest effect. Of course, the ideal, calculated signal images cannot be achieved in this way in a real measurement, but for an adequate selection of the measuring tolerance, the result can be transferred.

Figures 7, 8:
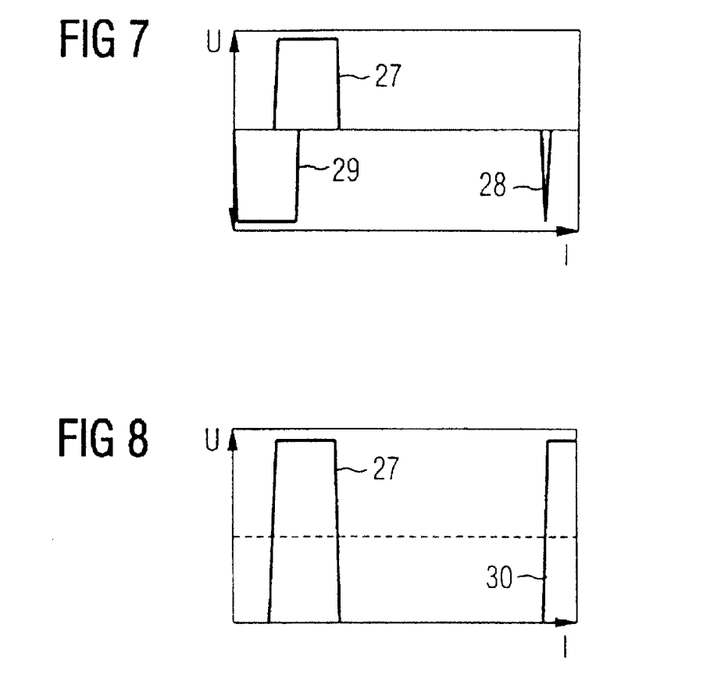
FIG. 7 is a timing diagram showing a modification of the test signal image for a terminating impedance R=0.
FIG. 8 is a timing diagram showing a modification of a test signal image for a suitable terminating impedance.

FIG. 7 shows the modification of the test signal image for a terminating impedance R=0, corresponding to the case P≈−1. The value at the right is the path of the electrical connection under test. The left edge corresponds to the starting point at which the test signal generator and evaluator lie. The right-hand edge corresponds to the location at which the reflection occurs, the location of the terminating impedance. The test signal runs from left to right and back. The test signal 27 is shown shortly after the start of the test, the test signal 28 shortly after the reflection, and the reply signal 29. This is the behavior of an electrical connection to ground in the "good" case, and, given a faulty connection, this is recognized as shorted to ground.

FIG. 8 shows the modification of the test signal image for a matched terminating impedance. This corresponds to the case P≈0. The test signal 27 is shown after the start of the test and the test signal 30 at the end of the electrical connection under test. Here, the characteristic impedance corresponds to the terminating impedance; no reflection occurs. An electrical connection to another component with matched input impedance is recognized as ok, and a faulty connection to a component with a high-impedance input is recognized as being shorted to another electrical connection.

Figure 9A:
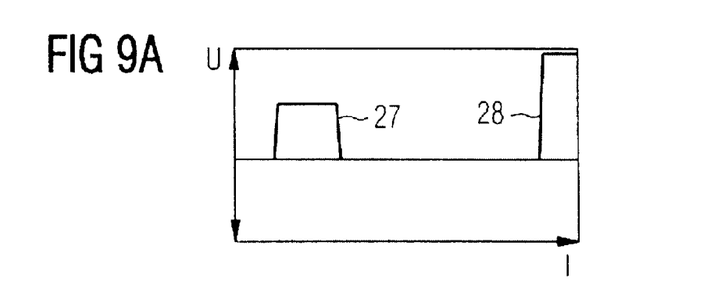
FIG. 9a is a timing diagram showing a modification of a test signal image for a terminating impedance R=∞.
Figure 9B:
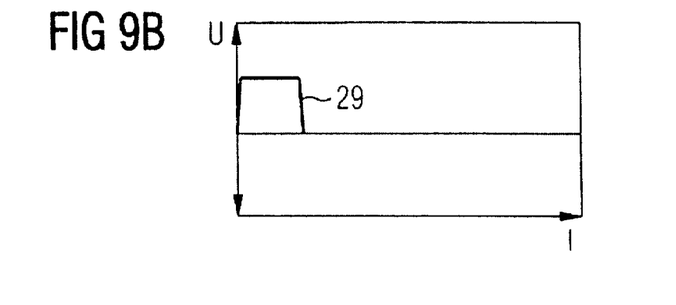
FIG. 9b is a timing diagram showing a modification of a test signal image for a terminating impedance R=∞.

FIGS. 9a and 9b show the modification of the test signal image for a terminating impedance R=∞. The test signal 27 after the start of the test and the test signal 28 shortly after the reflection at the end of the electrical connection under test are shown in FIG. 9a. FIG. 9b shows the reply signal. In this case, the terminating impedance is very high compared to the characteristic impedance R→∞). As a fault, this corresponds to a missing connection (missing contact) and corresponds to an open connection for the expected "good" case.

The test on the basis of these three values of the reflection coefficient enables a test without having to previously calculate the exact values of the "good" case, as would be required for other intermediate values of the reflection coefficient. The error categorization is rather clear for these values. Accordingly, a test program for the component can be developed from a determination of the resistances adjacent at the pins in a defined condition without having to subject the overall circuit to a measurement or calculation of anticipated values.

Furthermore, an inventive testing device can be advantageously integrated on an electrical circuit in addition to the known boundary scan testing method, this inventive testing device specifically testing the connections. These can also be tested by the inventive testing device during the service life of the digital circuit, in contrast to the production test methods according to the boundary scan method.

The above-described method, circuit, and device are illustrative of the principles of the present invention. Numerous modifications and adaptations thereof will be readily apparent to those skilled in this art without departing from the spirit and scope of the present invention.

What is claimed is:

1. An electrical circuit comprising:
   a testing device for testing electrical connections quality in the said electrical circuit;
   a test signal generator for generating a test signal and supplying said generated test signal to an electrical connection to be tested;
   an evaluator for receiving a reply signal from the said connection under test in response to a supplied said test signal, said evaluator being configured for registering a propagation time between test signal and reply signal, and comparing said reply signal to an anticipated signal, and evaluating a quality of said tested electrical connection on a basis of said propagation time and said signal comparison.

2. An electrical circuit according to claim 1, wherein said test signal generator supplies said test signal at a same end of said electrical connection under test at which said evaluator receives said reply signal.

3. An electrical circuit according to claim 1, wherein said test signal generator is configured to generate a test signal with a signal width tab, so that a length over which said test signal runs on said connection under test given an appertaining wavelength λ is greater than approximately λ/2.

4. An electrical circuit according to claim 1, further comprising
   a delay element connected between said test signal generator and said connection under test, said delay element being given a test signal with a signal width $t_{ab}$ generated by said test signal generator, lengthening said propagation time of said test signal over said electrical connection under test such that an apparent length over which said test signal runs on said connection under test is greater than approximately λ/2 given an appertaining wavelength λ.

5. An electrical circuit according to claim 1, wherein said test signal generator is configured to generate said test signal having a signal rise time $t_r$, defined as a time span in which said signal has a value rises from 10% of a full value to 90% of said full value, so that said propagation time of said test signal over said electrical connection under test is greater than approximately $t_r$.

6. An electrical circuit according to claim 1, further comprising:
   a delay element connected between said test signal generator and said connection under test, said delay element being given said test signal generated by said test signal generator with a signal rise time $t_r$ defined as a time span in which a signal value rises from 10% of a value to 90% of said value, lengthening said propagation time of said test signal over said electrical connection to be tested to more than $t_r$.

7. An electrical circuit according to claim 1, wherein said evaluator is configured to define a maximum value of said reply signal, check whether said maximum value of the reply signal lies within a time span $t_1$ through $t_2$, and then compare said reply signal to said anticipated signal.

8. An electrical circuit according to claim 7, further comprising:
a latch;
a decoder;
said evaluator being configured to compare said reply signal to reference voltages in analog fashion and store a value in said latch for every exceeded reference voltage, and being configured to convert said value into a data word of a specific width in said decoder.

9. An electrical circuit according to claim 7, wherein said evaluator is configured to compare said maximum value of said reply signal to an anticipated value upon allowance of a tolerance thus evaluating an electrical connection quality.

10. An electrical circuit according to claim 9, wherein said evaluator is configured to compare said maximum value of said reply signal to a negative maximum value of said test signal as an anticipated value thus recognizing an electrical connection to ground as a proper condition and a faulty connection as a short to ground.

11. An electrical circuit according to claim 9, wherein said evaluator is configured to compare said maximum value of said reply signal to zero, thus recognizing an electrical connection to another component with matched input impedance as a proper condition and a faulty connection to a component with high-impedance input as being shorted to another electrical connection.

12. An electrical circuit according to claim 9, wherein said evaluator is configured to compare said maximum value of said reply signal to a positive maximum value of said test signal as an anticipated value thus recognizing an electrical connection to an open terminal as a proper condition and a faulty connection as being interrupted.

13. An electrical circuit according to claim 1 further comprising:
a test controller; and
in interface via which said test controller outputs test results that it has collected.

14. An electrical component comprising:
an integrated circuit which comprises an electrical circuit, said electrical circuit comprising:
a testing device for testing electrical connections quality in the said electrical circuit;
a test signal generator for generating a test signal and supplying said generated test signal to an electrical connection to be tested;
an evaluator for receiving a reply signal from the said connection under test in response to a supplied said test signal, said evaluator being configured for registering a propagation time between test signal and reply signal, and comparing said reply signal to an anticipated signal, and evaluating a quality of said tested electrical connection on a basis of said propagation time and said signal comparison.

15. An electrical component according to claim 14, further comprising:
terminals which are connected in a star configuration to said evaluator for a successive reception of said reply signal;
said test signal generator, to which all of said terminals a connection of other components are connected in a star configuration, being configured to provide a successive delivery of said test signal to said terminals.

16. An electrical component according to claim 14, further comprising:
two drivers; and
existing boundary scan cells according to the JTAG standard that conduct said test signal to said connections to be tested, said boundary scan cells being expanded by said two drivers.

17. An electrical component according to claim 16, wherein a test controller, given a test architecture according to the boundary scan method, outputs test results, and a control command set of said test controller is expanded by a command to output said test results.

18. A method for testing a quality of electrical connections in electrical circuits, comprising the steps of:
generating a defined test signal by a testing device in said electrical circuits;
supplying said generated test signal to an electrical connection to be tested;
receiving a reply signal from said connection under test in response to said supplied test signal;
determining a propagation time between said test signal and said reply signal; and
comparing said reply signal to an anticipated signal for evaluating a quality of said electrical connection.

19. A method according to claim 18, wherein said test signal is supplied at a same end of said electrical connection under test at which said reply signal is received.

20. A method according to claim 18, wherein said test signal has a signal width of $t_{ab}$, so that a length over which said test signal runs on said connection under test at an appertaining wavelength $\lambda$ is greater than approximately $\lambda/2$.

21. A method according to claim 18, wherein said propagation time of said test signal over said electrical connection under test is lengthened such that an apparent length over which said test signal runs on said connection under test is greater than approximately $\lambda/2$ given an appertaining wavelength $\lambda$.

22. A method according to claim 18, wherein said test signal has a signal rise time $t_r$, defined as a time span wherein said signal has a value that rises from approximately 10% of its full value to approximately 90% of its full value, so that the propagation time of said test signal over said electrical connection under test is greater than approximately $t_r$.

23. A method according to claim 18, wherein said propagation time of said test signal over said electrical connection under test is lengthened such that, given a signal rise time $t_r$, defined as a time span in which a value of said signal rises from approximately 10% of its full value to approximately 90% of its full value, said propagation time is more than $t_r$.

24. A method according to claim 18, further comprising the steps of:
defining a maximum value of said reply signal;
checking to see whether said maximum value of said reply signal lies within a time span $t_1$ through $t_2$; and
comparing said reply signal to said anticipated signal.

25. A method according to claim 24, wherein said step of defining a maximum value comprises the steps of:
comparing said reply signal to reference voltages in analog fashion;
storing a value in a latch for each exceeded said reference voltage; and
converting said stored values into a data word of a specific width in a decoder.

26. A method according to claim 24, further comprising the step of:
comparing said maximum value of said reply signal is compared to an anticipated value upon allowance of a tolerance, thus evaluating said quality of said electrical connection.

27. A method according to claim 26, further comprising the steps of:
- comparing said maximum value of said reply signal to a negative maximum value of said test signal as an anticipated value;
- recognizing an electrical connection to ground as a proper condition; and
- recognizing a faulty connection as shorted to ground.

28. A method according to claim 26, further comprising the steps of:
- comparing said maximum value of said reply signal to zero;
- recognizing an electrical connection to another component with matched input impedance as a proper condition; and
- recognizing a faulty connection to a component with high-impedance input as shorted to another electrical connection.

29. A method according to claim 26, further comprising the steps of
- comparing said maximum value of said reply signal to a positive maximum value of said test signal as an anticipated value;
- recognizing an electrical connection to an open terminal as a proper condition; and
- recognizing a faulty connection as interrupted.

30. A method according to claim 18, further comprising the steps of:
- successively supplying, within an integrated component, a test signal to all electrical connections to be tested proceeding from a single test signal generator; and
- successively receiving and evaluating said reply signals in a single evaluation device.

31. A method according to claim 18, further comprising the steps of:
- collecting said test results via said test controller; and
- outputting said test results via an interface.

* * * * *

UNITED STATES PATENT AND TRADEMARK OFFICE
CERTIFICATE OF CORRECTION

PATENT NO.   : 6,617,869 B1
DATED        : September 9, 2003
INVENTOR(S)  : Pillkahn It is certified that error appears in the above-identified patent and that said Letters Patent is hereby corrected as shown below:

Column 12,
Line 32, delete the word "tab" and replace with -- $t_{ab}$ --

Signed and Sealed this

Fifteenth Day of June, 2004

JON W. DUDAS
*Acting Director of the United States Patent and Trademark Office*